United States Patent
Yoshimochi

(10) Patent No.: US 7,470,589 B2
(45) Date of Patent: Dec. 30, 2008

(54) SEMICONDUCTOR DEVICE

(75) Inventor: Kenichi Yoshimochi, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 58 days.

(21) Appl. No.: 11/610,240

(22) Filed: Dec. 13, 2006

(65) Prior Publication Data
US 2007/0082416 A1 Apr. 12, 2007

Related U.S. Application Data

(62) Division of application No. 10/948,692, filed on Sep. 24, 2004, now Pat. No. 7,166,891.

(30) Foreign Application Priority Data
Oct. 1, 2003 (JP) .............................. 2003-342712

(51) Int. Cl.
*H01L 21/336* (2006.01)
(52) U.S. Cl. .................... 438/272; 438/273; 438/589; 257/330; 257/E21.419

(58) Field of Classification Search ................. 438/272; 257/E21.419
See application file for complete search history.

(56) References Cited

U.S. PATENT DOCUMENTS

| 5,148,257 | A | 9/1992 | Kishi |
| 6,319,784 | B1 * | 11/2001 | Yu et al. ..................... 438/301 |
| 6,861,701 | B2 | 3/2005 | Williams et al. |
| 6,884,684 | B2 | 4/2005 | Huang et al. |
| 2002/0130359 | A1 | 9/2002 | Okumura et al. |
| 2002/0137306 | A1 | 9/2002 | Chen |
| 2003/0080378 | A1 | 5/2003 | Zundel et al. |

FOREIGN PATENT DOCUMENTS

JP 2002-280553 A 9/2002

* cited by examiner

*Primary Examiner*—Tu-Tu V Ho
(74) *Attorney, Agent, or Firm*—Keating & Bennett, LLP

(57) ABSTRACT

A trench-structure semiconductor device is highly reliable and has an increased resistance to hydrofluoric acid cleaning or other cleaning of an insulation film between a gate electrode, which is embedded in a trench, and source electrode. In a trench-structure semiconductor device, a silicon nitride film is over the gate electrode and embedded up to a point close to the open edge on the inside of trench. A source electrode is formed in contact with the surface of the silicon nitride film and the surface of the source region.

5 Claims, 3 Drawing Sheets

SEMICONDUCTOR DEVICE

This application is a Divisional Application of U.S. patent application Ser. No. 10/948,692 filed Sep. 24, 2004, currently pending.

BACKGROUND OF THE INVENTION

1. Field of the Invention

The present invention relates to a semiconductor device and, more particularly, to a semiconductor device with a trench structure in which a MOSFET is arranged along the side of a trench.

2. Description of the Related Art

The demand for semiconductor devices with a trench structure is generally increasing because lower ON resistance can be achieved in comparison with semiconductor devices with a planar-type DMOSFET (double diffusion MOSFET) in which a channel region is formed in the surface of a semiconductor substrate.

FIG. 4 shows a semiconductor device with a conventional trench structure. A semiconductor device 101 has MOSFETs arranged along the sides of grooves (trenches) 120 formed in the surface of an $N^-$-type semiconductor substrate (also including an epitaxial layer) 111. That is, an $N^-$-type drain region 112, a $P^-$-type base region 113, and an $N^+$-type source region 114 are formed in that order from the rear along the sides of the trenches 120 and gate electrodes 121 are embedded within the trenches 120.

A gate oxide film 123, which is a thin silicon oxide film, is formed between the trenches 120 and the gate electrodes 121. The gate oxide film 123 extends to the surface of the semiconductor substrate 111 and, similarly to an insulation silicon oxide film 124 that will be described subsequently, a portion that will become a contact hole 128 is removed by etching. A $P^+$-type base high concentration region 115 with a high impurity concentration that is linked to the base region 113 is formed in the surface portion of the semiconductor substrate 111 and a metal-layer source electrode 122 that contacts with the base high concentration region 115 and source region 114 is formed on the surface of the semiconductor substrate 111. Therefore, the base high concentration region 115 is in ohmic contact with the source electrode 122 and reduces the resistive constituent of the base region 113. Further, for the electrical insulation of the gate electrode 121 and source electrode 122, the insulation silicon oxide film 124 is formed on the upper surface of the gate electrode 121 and gate oxide film 123. When the insulation silicon oxide film 124 is removed by etching on the surface of the source region 114 and base high concentration region 115, the removed portion becomes a contact hole 128.

However, in the contact hole formation step for this semiconductor device 101, a suitable distance between the contact hole 128 and gate electrode 121, that is, a tolerance, is required so that, even when the alignment with the underlayers (each of the layers already formed for the semiconductor device 101) of the contact-hole formation photo mask is displaced or the finishing accuracy of the photoresist is somewhat poor, the contact hole 128 is not formed in the upper surface of the gate electrode 121. This tolerance is one factor that prevents the miniaturization of the semiconductor device 101.

Therefore, in order to remove one primary factor preventing the miniaturization, the semiconductor device shown in FIG. 5 has been proposed (Japanese Patent Application Laid Open No. 2002-280553, for example). Common elements that have substantially the same function as those shown in FIG. 4 have been assigned the same reference numerals and will not be described here. The semiconductor device 102 includes an insulation silicon oxide film 127 that is embedded within the trenches 120 instead of the aforementioned insulation silicon oxide film 124. The insulation silicon oxide film 127 is not formed on the upper surface of the semiconductor substrate 111, unlike the insulation silicon oxide film 124. Hence, a contact hole for establishing contact of the source electrode 122 to source region 114 and base high concentration region 115 need not be provided and, consequently, nor is the tolerance required. As a result, a more miniaturized trench-structure semiconductor device can be realized.

However, in the case of the semiconductor device 102, a step of removing the gate oxide film and the silicon oxide film formed by natural oxidation (native oxide film), on the surface of the semiconductor substrate 111, is required as a step prior to a metal-layer formation step in which a metal layer, which is to form the source electrode 122, is deposited by CVD, sputtering, or the like.

Thus, cleaning with hydrofluoric acid (hydrofluoric acid cleaning) or the like is performed. However, the insulation silicon oxide film 127 is the same oxide film as the gate oxide film, native oxide film, and the like, and is therefore removed at the same time by this cleaning. Therefore, a design in which the amount of removal achieved by this cleaning is estimated must be required and a management of the cleaning solution, cleaning time, and so forth, must be maintained highly accurately. That is, when highly accurate management, and so forth, is not performed, the amount of insulation silicon oxide film 127 removed increases and the thickness of the resultant insulation silicon oxide film 127 is then thinner than a predetermined value. Thus, in an extreme case, adequate insulation strength is no longer obtained between the gate electrode 121 and source electrode 122 and the capacity for controlling the invasion of potassium or sodium mobile ions or other mobile ions into the gate electrode 121 is reduced. There is therefore a risk of a decrease in the reliability of the semiconductor device.

SUMMARY OF THE INVENTION

In order to overcome the problems described above, preferred embodiments of the present invention provide a highly reliable semiconductor device in which the thickness of the insulation film between the gate electrode, which is embedded in a trench, and the source electrode is maintained.

In order to achieve the advantages described above, a semiconductor device according to a preferred embodiment of the present invention includes a MOSFET in which a source region, a base region, and a drain region are arranged along a side of a trench formed in the surface of a semiconductor substrate and a gate electrode is embedded within the trench, and a film that is resistant to cleaning for removing silicon oxide and that is formed over the gate electrode, wherein a source electrode is arranged to be in contact with the surface of the film and the surface of the source region.

The film that is resistant to the cleaning for removing silicon oxide can preferably be a silicon nitride film. The film could also be a polysilicon film, in which case a silicon oxide film is preferably provided between the polysilicon film and the gate electrode.

In a semiconductor device according to at least one of the preferred embodiments of the present invention, a silicon nitride film or polysilicon or other suitable film is preferably formed directly or indirectly on the upper surface of the gate electrode embedded within the trench, and a source electrode is formed in contact with the silicon nitride film or polysilicon or other suitable film. Therefore, even when the cleaning in a step prior to the metal layer formation step is performed, the resistance of the insulation film to hydrofluoric acid cleaning or other cleaning can be enhanced and, consequently, a highly reliable semiconductor device can be provided.

Other features, elements, steps, characteristics and advantages of the present invention will become more apparent from the following detailed description of the present invention with reference to the attached drawings.

DETAILED DESCRIPTION OF PREFERRED EMBODIMENTS

Figure 1:
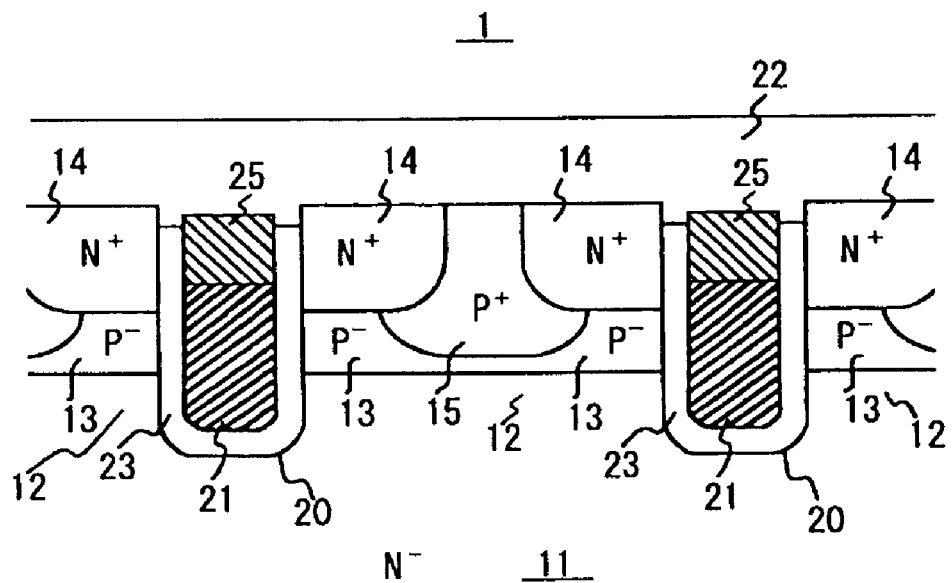
FIG. 1 is a cross-sectional view of a semiconductor device with a trench structure according to a preferred embodiment of the present invention.

Preferred embodiments of the present invention will be described with reference to the drawings. FIG. 1 is a cross-sectional view of the semiconductor device of a preferred embodiment of the present invention. This trench-structure semiconductor device 1 includes MOSFETs arranged along the sides of grooves (trenches) 20 formed in the surface of an N$^-$-type semiconductor substrate (also including an epitaxial layer) 11. That is, an N$^{31}$-type drain region 12, P$^-$-type base regions 13, and N$^+$-type source regions 14 are formed in that order from the rear along the sides of the trenches 20 and gate electrodes 21 are embedded within the trenches 20. The upper surfaces of the gate electrodes 21 are located at a point sufficiently below the open edges of the trenches 20, that is, the surface of the semiconductor substrate 11.

A gate oxide film 23, which is preferably a thin silicon oxide film, is formed between each trench 20 and gate electrode 21, and the gate oxide film 23 extends to a position slightly below the open edge of the trench 20, that is, the surface of the semiconductor substrate 11. A P$^+$-type base high concentration region 15 with a high impurity concentration that is linked to the base region 13 is formed in the surface section of the semiconductor substrate 11 and a metal-layer source electrode 22 that contacts with the base high concentration region 15 and source region 14 is formed on the surface of the semiconductor substrate 11. Therefore, the base high concentration region 15 makes ohmic contact with the source electrode 22 and reduces the resistive constituent of the base region 13. Further, the important point here is that, for electrical isolation between the gate electrode 21 and source electrode 22, a silicon nitride film 25 on the gate electrode 21 that is embedded up to a point that is close to the open edge on the inside of the trench 20 is formed. Therefore, the source electrode 22 is in mechanical and electrical contact with the entire surface of the base high concentration region 15 and source region 14, and is in mechanical contact with the surface of the silicon nitride film 25.

Further, the drain region 12 is formed in a region outside the source region 14, the base region 13, and the base high concentration region 15 of the semiconductor substrate 11.

Further, the MOSFET of the semiconductor device 1 is preferably an N-type MOSFET but it goes without saying that same can be rendered a P-type MOSFET by reversing each of the conductivity types of the regions 12, 13, 14, and 15.

Figure 2:
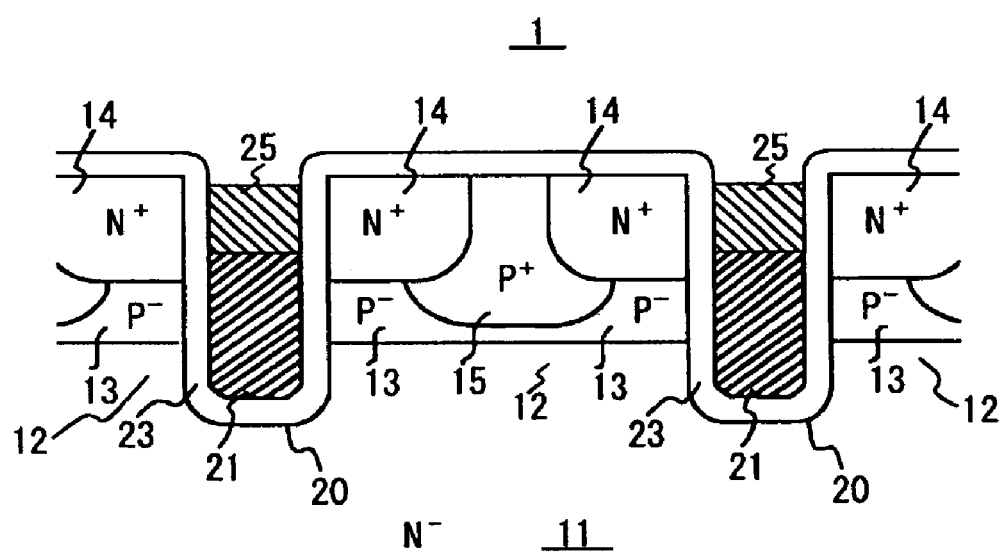
FIGS. 2A and 2B are cross-sectional views of a state before and after the cleaning step thereof.

Next, the characteristic steps of a method of fabricating the trench-structure semiconductor device 1 will be described. FIG. 2A shows a semiconductor device 1 prior to hydrofluoric acid cleaning or other cleaning. The trenches 20 are preferably formed by subjecting the surface of the semiconductor substrate 11 to selective anisotropic dry etching. The source region 14, the base region 13, and the base high concentration region 15 are formed preferably by performing impurity ion implantation or impurity diffusion or other suitable process on the semiconductor substrate 11. The gate oxide film 23 is formed by oxidizing the semiconductor substrate 11 in a state in which the trenches 20 exist. Following deposition of polysilicon by CVD, sputtering, or other suitable process, the gate electrodes 21 are formed within the trenches 20 via the gate oxide film 23 by etching or other suitable process. The silicon nitride films 25 are preferably formed by performing deposition by CVD or other suitable process on the upper surface of the gate electrode 21 and then etching or other suitable process.

Therefore, in this state, a gate oxide film 23 exists within the trench 20 and on the surface of the semiconductor substrate 11. By cleaning the semiconductor device 1 in this state with hydrofluoric acid or similar, the gate oxide film 23 and a silicon oxide film (native oxide film) formed as a result of natural oxidation, on the surface of the semiconductor substrate 11, are removed.

Figure 2B:
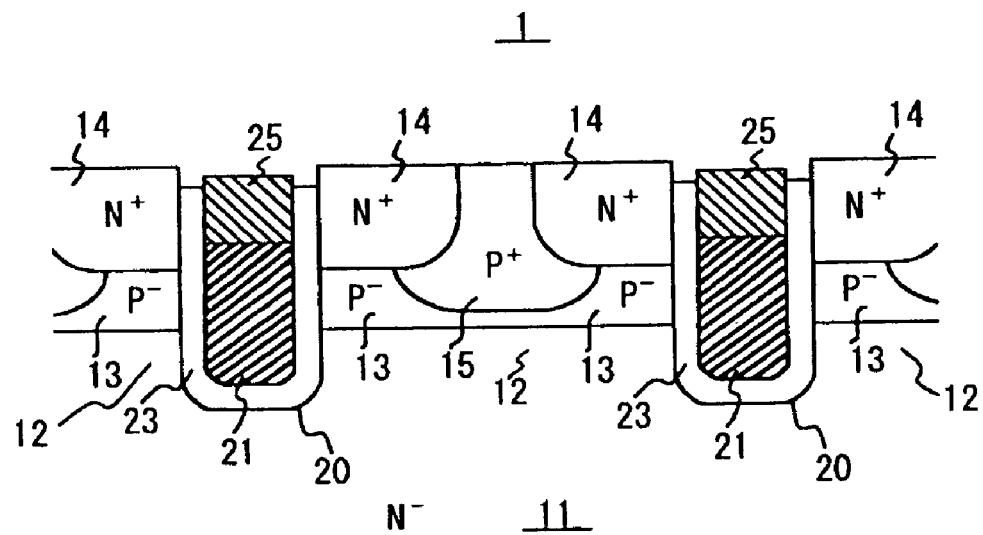

FIG. 2B shows the semiconductor device 1 after cleaning, that is, in a state where the gate oxide film 23 and a silicon oxide film (native oxide film) formed by natural oxidation, on the surface of the semiconductor substrate 11, have been removed. Working from this state, after depositing a metal layer on the exposed surface of the semiconductor substrate 11 by CVD, sputtering, or other suitable process, a metal-layer source electrode 22 that is in a state of contact with the base region 13 and base high concentration region 15 is formed by performing patterning using an etching process or similar. In this case, because the portion of the trench 20 has the silicon nitride film 25, the source electrode 22 and gate electrode 21 can be electrically isolated.

Although the silicon oxide film (gate oxide film 23, native oxide film) is selectively removed when the semiconductor device 1 undergoes cleaning such as the aforementioned hydrofluoric acid cleaning, the thickness of the silicon nitride film 25 is barely reduced. In other words, the resistance of the insulation film to hydrofluoric acid cleaning or other cleaning is enhanced. Therefore, in the trench-structure semiconductor device 1 prior to and following completion, adequate insulation strength can be obtained between the gate electrode 21 and source electrode 22 and the capacity for preventing the invasion of mobile ions such as sodium or potassium into the gate electrode 21 is not reduced. Therefore, high reliability can be maintained. In addition, the silicon nitride film 25 also has a gettering effect on mobile ions, and hence has a high capacity for controlling the invasion of mobile ions.

Further, a silicon oxide film or similar film may be interposed between the silicon nitride film 25 and gate electrode 21 to stabilize the interface between. In this case, it is understood that, when hydrofluoric acid cleaning or other cleaning is performed, the thickness of the silicon nitride film 25 is barely reduced and the resistance of the insulation film to hydrofluoric acid cleaning or other cleaning is enhanced.

Figure 3:
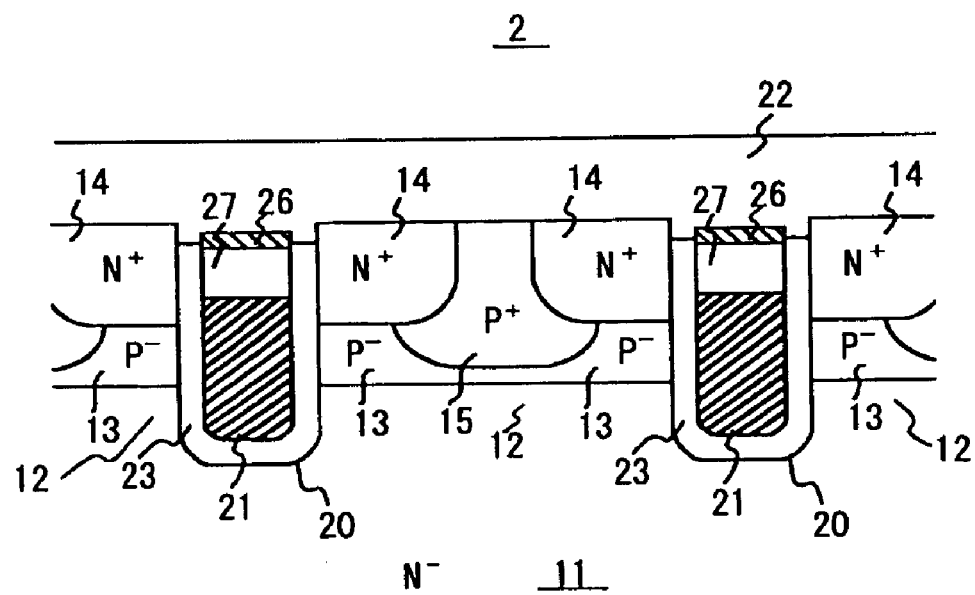
FIG. 3 is a cross-sectional view of a semiconductor device with a trench structure according to another preferred embodiment of the present invention.
Figure 4:
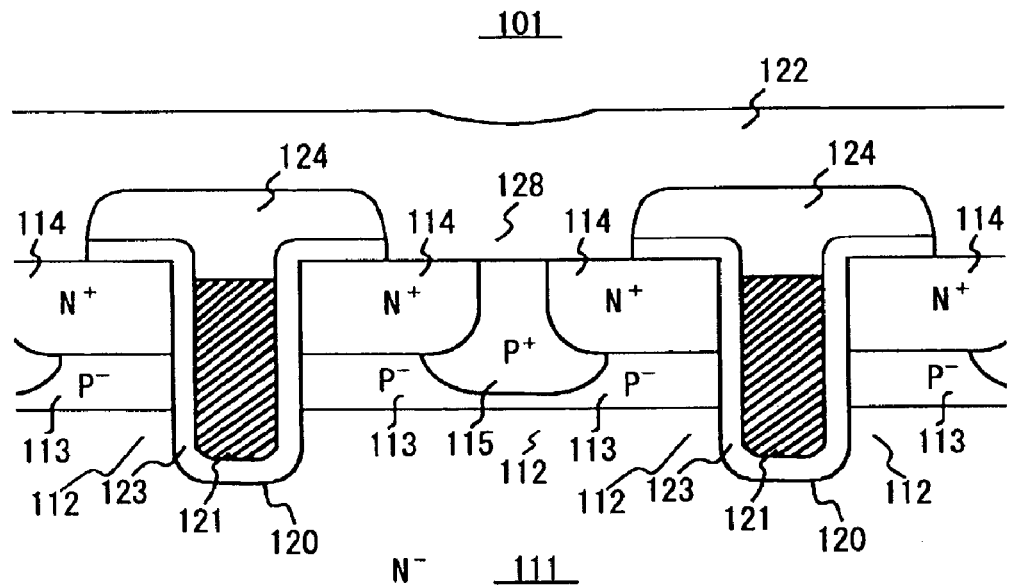
FIG. 4 is a cross-sectional view of a semiconductor device with a trench structure of the prior art.
Figure 5:
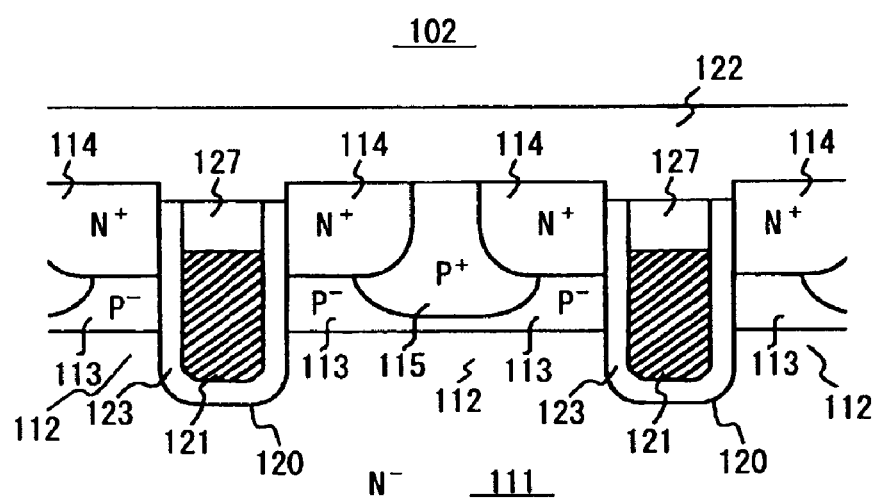
FIG. 5 is a cross-sectional view of a semiconductor device with another trench structure of the prior art.

Next, a semiconductor device with a trench structure constituting another preferred embodiment of the present invention will be described. FIG. 3 is a cross-sectional view of this semiconductor device 2. The semiconductor device 2 preferably includes a polysilicon film 26 instead of the silicon nitride film 25 of the previous preferred embodiment and includes a silicon oxide film 27, between the polysilicon film 26 and gate electrode 21, which electrically isolates the source electrode 22 and gate electrode 21. The elements that have substantially the same function as the elements of the previous preferred embodiment have been assigned the same reference numerals and will not be described here. The polysilicon film 26 protects the silicon oxide film 27 so that the thickness thereof is not reduced in the hydrofluoric acid cleaning or other cleaning and is actually capable of enhancing the resistance of the insulation film to hydrofluoric acid cleaning or other cleaning.

Therefore, as with the semiconductor device 1, in the case of the semiconductor device 2, the resistance of the insulation film to hydrofluoric acid cleaning or other cleaning can be enhanced and, in turn, adequate insulation strength can be obtained between the gate electrode 21 and source electrode 22 and the capacity for controlling the invasion of mobile ions of sodium or potassium or other mobile ions into the gate electrode 21 is not reduced. Therefore, a high degree of reliability can be maintained. In addition, because the mobile-ion gettering effect can be obtained when the polysilicon film 26 is doped with phosphorus at high concentration, the capacity for controlling the mobile ion invasion is further increased. The silicon oxide film 27 of the semiconductor device 2 is formed by performing deposition by CVD or other suitable process and then etching or other suitable process, and the polysilicon film 26 is formed by depositing polysilicon by CVD, sputtering, or other suitable process and then etching and doping with phosphorous after or prior to the etching. Other fabrication methods are omitted because such methods are the same as that for semiconductor device 1.

Further, the present invention is not limited to the above-described preferred embodiments. A variety of design modifications is possible within the scope of the items appearing in the claims.

What is claimed is:

1. A method of forming a semiconductor device comprising the steps of:
    providing a semiconductor substrate;
    forming a trench in a surface of the semiconductor substrate;
    forming a MOSFET including a source region, a base region, and a drain region arranged along a side of the trench;
    forming a gate oxide film on the surface of the semiconductor substrate and within the trench;
    forming a gate electrode within the trench;
    forming a film over the gate electrode, the film being resistant to cleaning for removing silicon oxide;
    cleaning the surface of the semiconductor substrate so as to remove the gate oxide film on the surface of the semiconductor substrate and between an open edge of the trench and a point just below a top surface of the film; and
    forming a source electrode so as to contact the top surface of the film and a surface of the source region.

2. The method according to claim 1, wherein the step of cleaning is performed by applying hydrofluoric acid to the surface of the semiconductor substrate.

3. The method according to claim 1, wherein the source region and the base region are formed by performing one of impurity ion implantation and impurity diffusion on the semiconductor substrate.

4. The method according to claim 1, wherein the film that is resistant to cleaning for removing silicon oxide is performed by deposition of a silicon nitride film on an upper surface of the gate electrode.

5. The method according to claim 1, wherein the film is a polysilicon film and a silicon oxide film is formed between the polysilicon film and the gate electrode.

* * * * *